(12) United States Patent
May et al.

(10) Patent No.: US 11,456,704 B2
(45) Date of Patent: *Sep. 27, 2022

(54) MULTI-PHASE POWER CONVERTER SYSTEM USING MULTIPLE AMPLIFIER INTEGRATED CIRCUITS

(71) Applicant: Cirrus Logic International Semiconductor Ltd., Edinburgh (GB)

(72) Inventors: Jeffrey Allen May, Dripping Springs, TX (US); Eric J. King, Austin, TX (US); Firas Azrai, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/600,621

(22) Filed: Oct. 14, 2019

(65) Prior Publication Data

US 2020/0044611 A1 Feb. 6, 2020

Related U.S. Application Data

(63) Continuation of application No. 15/582,861, filed on May 1, 2017, now Pat. No. 10,530,303.

(60) Provisional application No. 62/341,386, filed on May 25, 2016.

(51) Int. Cl.
*H03F 1/02* (2006.01)
*H03F 3/187* (2006.01)
*H02M 3/158* (2006.01)

(52) U.S. Cl.
CPC .......... *H03F 1/0227* (2013.01); *H02M 3/158* (2013.01); *H03F 3/187* (2013.01); *H03F 2200/03* (2013.01); *H03F 2200/504* (2013.01)

(58) Field of Classification Search
CPC ................... H03F 1/0211; H03F 1/30
USPC ................................... 330/127, 297
See application file for complete search history.

(56) References Cited

U.S. PATENT DOCUMENTS

| 6,255,906 | B1 | 7/2001 | Edison et al. | |
| 7,129,786 | B2 * | 10/2006 | Kim | H03F 1/025 330/297 |
| 7,372,333 | B2 * | 5/2008 | Abedinpour | H03F 1/0227 330/297 |
| 7,701,294 | B1 | 4/2010 | Yun | |
| 7,755,431 | B2 | 7/2010 | Sun | |

(Continued)

FOREIGN PATENT DOCUMENTS

| EP | 2562920 A2 | 2/2013 |
| EP | 3016236 A1 | 5/2016 |
| EP | 3109986 A1 | 12/2016 |

OTHER PUBLICATIONS

Combined Search and Examination Report of the UKIPO, Application No. GB1707741.3, dated Oct. 12, 2017.

(Continued)

*Primary Examiner* — Henry Choe
(74) *Attorney, Agent, or Firm* — Jackson Walker L.L.P.

(57) ABSTRACT

In accordance with embodiments of the present disclosure, a system may include a circuit having a power converter and an amplifier, wherein the power converter is configured to generate an intermediate voltage, provide the intermediate voltage as an amplifier supply voltage to the amplifier, and share the intermediate voltage with one or more additional circuits external to the circuit, wherein at least one of the one or more additional circuits is configured to generate the intermediate voltage.

34 Claims, 11 Drawing Sheets

(56) References Cited

U.S. PATENT DOCUMENTS

| | | | |
|---|---|---|---|
| 7,864,970 B2* | 1/2011 | Niwa | H03F 3/181 |
| | | | 381/113 |
| 8,446,219 B2 | 5/2013 | Mohajeri et al. | |
| 8,803,605 B2 | 8/2014 | Fowers et al. | |
| 8,947,161 B2 | 2/2015 | Khlat et al. | |
| 8,975,960 B2* | 3/2015 | Strange | H03F 1/0222 |
| | | | 330/127 |
| 9,007,126 B2* | 4/2015 | Langer | H03G 3/3042 |
| | | | 330/127 |
| 9,106,183 B2* | 8/2015 | Liu | H03F 1/0216 |
| 2003/0222634 A1* | 12/2003 | Santin | H03F 1/30 |
| | | | 324/76.79 |
| 2007/0226526 A1 | 9/2007 | Chapuis et al. | |
| 2008/0068768 A1 | 3/2008 | Wu et al. | |
| 2013/0207467 A1 | 8/2013 | Fernald | |
| 2014/0057684 A1 | 2/2014 | Khlat | |
| 2014/0240040 A1 | 8/2014 | Langer | |
| 2014/0266427 A1 | 9/2014 | Chiron | |
| 2014/0306756 A1 | 10/2014 | Henshaw et al. | |
| 2014/0327485 A1 | 11/2014 | Tseng et al. | |
| 2014/0361837 A1 | 12/2014 | Strange et al. | |
| 2014/0375382 A1* | 12/2014 | Midya | H03G 3/3042 |
| | | | 330/127 |
| 2015/0030183 A1 | 1/2015 | Pazhayaveetil et al. | |
| 2015/0045095 A1 | 2/2015 | Souza et al. | |
| 2015/0061761 A1 | 3/2015 | Wills et al. | |
| 2015/0222184 A1 | 8/2015 | Melanson et al. | |

OTHER PUBLICATIONS

International Search Report and Written Opinion of the International Searching Authority, International Application No. PCT/US2017/032665, dated Sep. 12, 2017.

Combined Search and Examination Report under Sections 17 and 18(3), UKIPO, Application No. GB2102157.1, dated Aug. 9, 2021.

* cited by examiner

TO FIG. 16B

US 11,456,704 B2

MULTI-PHASE POWER CONVERTER SYSTEM USING MULTIPLE AMPLIFIER INTEGRATED CIRCUITS

RELATED APPLICATIONS

The present disclosure is a continuation of U.S. Non-Provisional patent application Ser. No. 15/582,861, filed May 1, 2017, which claims priority to U.S. Provisional Patent Application Ser. No. 62/341,386, filed May 25, 2016, each of which is incorporated by reference herein in its entirety.

FIELD OF DISCLOSURE

The present disclosure relates in general to circuits for audio systems, including without limitation personal audio devices such as wireless telephones and media players, and more specifically, to control and/or management of a distributed network of power converters and amplifiers within an audio system.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a speaker driver including a power amplifier for driving an audio output signal to headphones or speakers.

Boosted audio amplifier integrated circuits (ICs) are often used in personal audio devices. Traditionally, such boosted amplifier ICs are often isolated devices which handle their own power management in isolation from other boosted amplifier ICs in a system. While a single, isolated device managing its own power consumption may be acceptable for single-channel audio (e.g., mono) applications, such an architecture places restrictions on a system when multiple boosted audio amplifiers are utilized for multi-channel audio.

SUMMARY

In accordance with the teachings of the present disclosure, one or more disadvantages and problems associated with existing approaches to synchronizing functionality among a distributed network of devices may be reduced or eliminated.

In accordance with embodiments of the present disclosure, a system may include a circuit having a power converter and an amplifier, wherein the power converter is configured to generate an intermediate voltage, provide the intermediate voltage as an amplifier supply voltage to the amplifier, and share the intermediate voltage with one or more additional circuits external to the circuit, wherein at least one of the one or more additional circuits is configured to generate the intermediate voltage.

In accordance with these and other embodiments of the present disclosure, a method may include, in a circuit having a power converter and an amplifier: generating an intermediate voltage by the power converter; providing, by the power converter, the intermediate voltage as an amplifier supply voltage to the amplifier; and sharing, by the power converter, the intermediate voltage with one or more additional circuits external to the circuit, wherein at least one of the one or more additional circuits is configured to generate the intermediate voltage.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

The multi-device synchronization approach disclosed herein may allow multiple, distributed devices in a network of devices to be aware of the operational state and configuration of each other, effectively performing as a single device on the system, while remaining low impact and low complexity to the system comprising the distributed devices. The multi-device synchronization may remain captive to the devices which are to have their operations synchronized.

Figure 1:
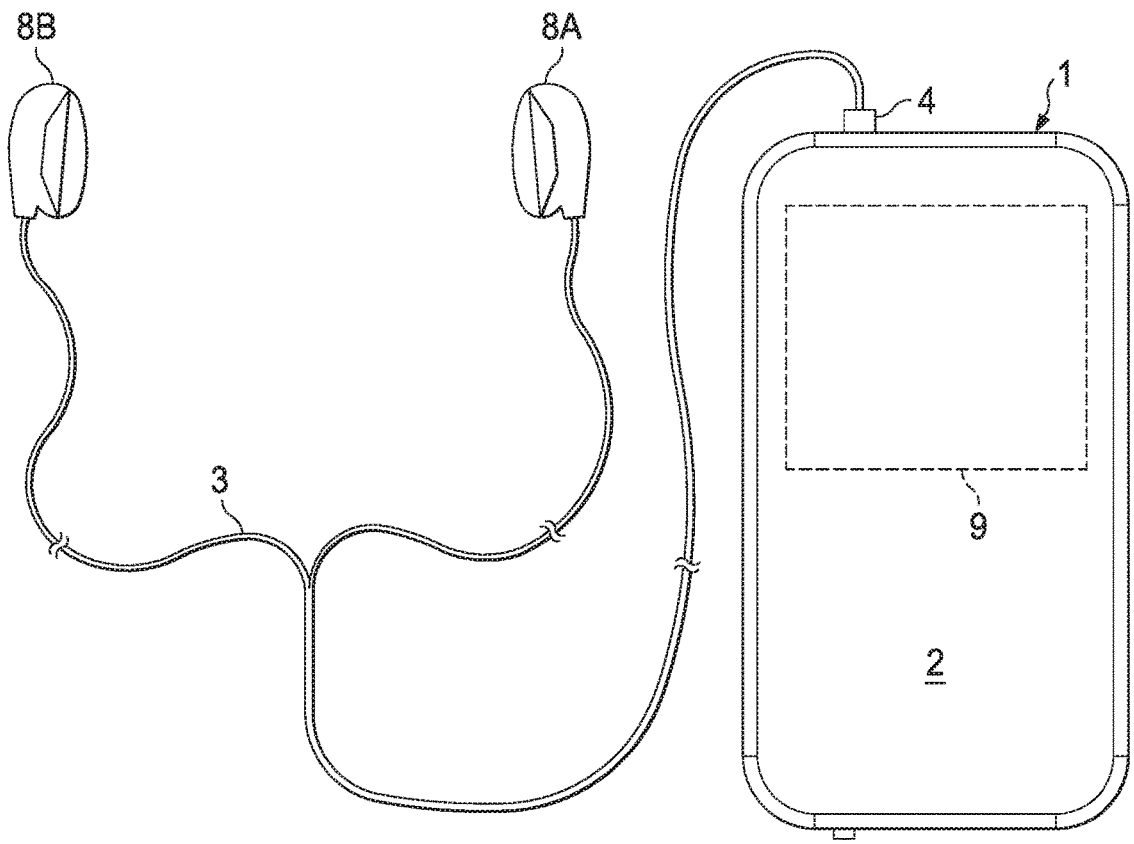
FIG. 1 illustrates an example personal audio device, in accordance with embodiments of the present disclosure.

FIG. 1 illustrates an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
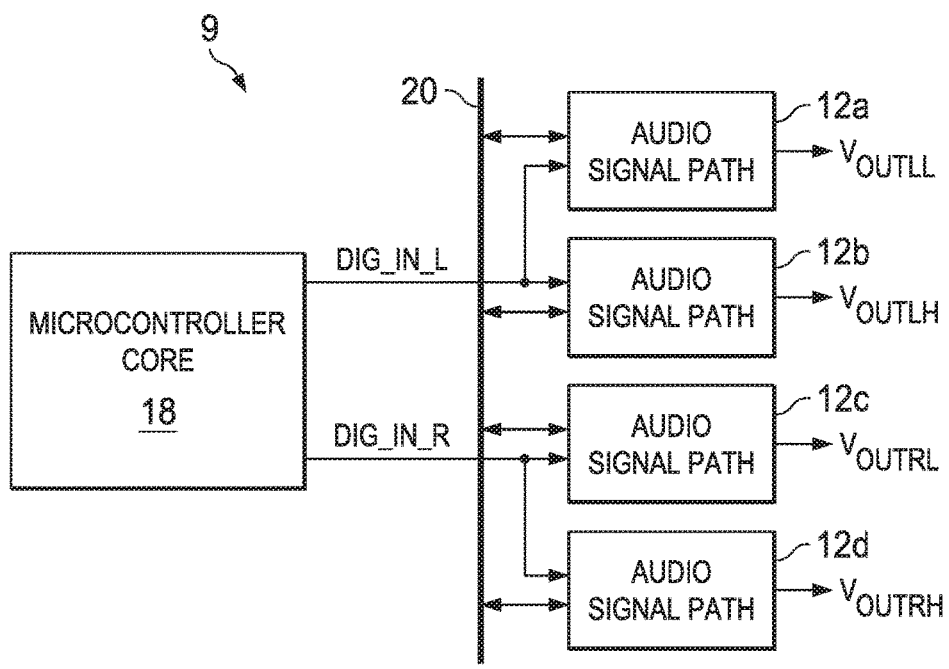
FIG. 2 illustrates a block diagram of selected components of an example audio integrated circuit of a personal audio device, in accordance with embodiments of the present disclosure.

FIG. 2 illustrates a block diagram of selected components of an example audio integrated circuit 9 of a personal audio device, in accordance with embodiments of the present disclosure. As shown in FIG. 2, a microcontroller core 18 may supply digital audio input signals DIG_IN_L and DIG_IN_R to multiple audio signal paths 12 (e.g., audio signal paths 12a, 12b, 12c, and 12d), each of which may generate its own analog output signal (e.g., $V_{OUTLL}$, $V_{OUTLH}$, $V_{OUTRL}$, and $V_{OUTRH}$) to drive a transducer, such as an audio speaker or headphone. For example, analog output signal $V_{OUTLL}$ may drive a left-side low-frequency speaker (e.g., woofer), analog output signal $V_{OUTLH}$ may drive a left-side high-frequency speaker (e.g., tweeter), analog output signal $V_{OUTRL}$ may drive a right-side low-frequency speaker (e.g., woofer), and analog output signal $V_{OUTRH}$ may drive a right-side high-frequency speaker (e.g., tweeter). Also as shown in FIG. 2, and as described in greater detail below, components of audio signal paths 12a, 12b, 12c, and 12d may be communicatively coupled to a shared communication bus 20 for communicating control and/or state information among such components.

Figure 3:
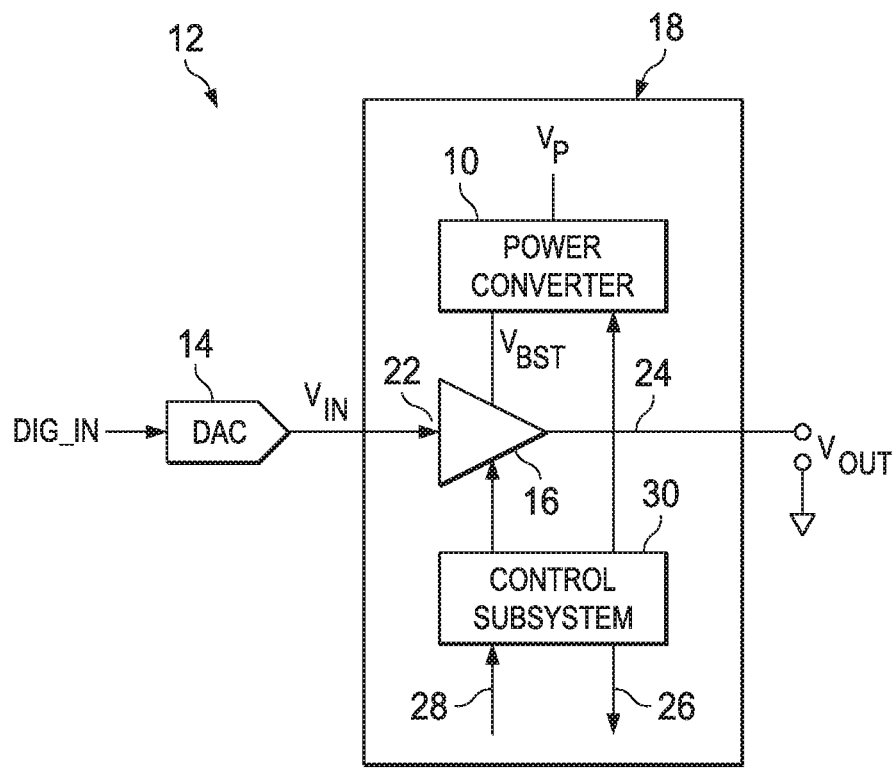
FIG. 3 illustrates a block diagram of selected components of an example audio signal path of an audio integrated circuit of a personal audio device, in accordance with embodiments of the present disclosure.

FIG. 3 illustrates a block diagram of selected components of an example audio signal path 12 of an audio integrated circuit 9 of a personal audio device 1, in accordance with embodiments of the present disclosure. Audio signal path 12 may be used to implement audio signal paths 12a, 12b, 12c, and/or 12d depicted in FIG. 2. As shown in FIG. 3, a digital-to-analog converter (DAC) 14 may receive a digital audio input signal DIG_IN (e.g., DIG_IN_L or DIG_IN_R) and convert the digital audio input signal to an analog signal $V_{IN}$. DAC 14 may supply analog signal $V_{IN}$ to an amplifier 16 which may receive analog signal $V_{IN}$ at an input 22 of amplifier 16 and may amplify or attenuate audio input signal $V_{IN}$ to provide an audio output signal $V_{OUT}$ (e.g., $V_{OUTLL}$, $V_{OUTLH}$, $V_{OUTRL}$, and $V_{OUTRH}$) at output 24 of amplifier 16, which may operate a speaker, a headphone transducer, a line level signal output, and/or other suitable output. In some embodiments, DAC 14 may be an integral component of amplifier 16.

As shown in FIG. 3, amplifier 16 may be part of a boosted audio amplifier IC 18 that may include a power converter 10, amplifier 16, and a control subsystem 30. Power converter 10 may comprise any suitable, system, device, or apparatus configured to convert a source voltage $V_P$ (e.g., from a battery or other source of electrical energy) to an intermediate voltage $V_{BST}$, which may be used by amplifier 16 as a source of electrical energy to perform its functionality In some embodiments, power converter 10 may be implemented using a boost converter configured to boost source voltage $V_P$ to intermediate voltage $V_{BST}$ such that the intermediate voltage $V_{BST}$ is greater than source voltage $V_P$.

As also depicted in FIG. 3, boosted audio amplifier IC 18 may include a control subsystem 30. As described in greater detail below, control subsystem 30 may comprise any suitable system, device, or apparatus configured to control operation of power converter 10, amplifier 16, and/or other devices communicatively coupled to boosted audio amplifier IC 18. Boosted audio amplifier IC 18 may also include a transmitter 26 for actively transmitting data in accordance with a communication protocol on a shared communication bus (e.g., shared communication bus 20) configured to couple to boosted audio amplifier IC 18 and a plurality of other devices (e.g., boosted audio amplifier ICs for other audio channels) coupled to the shared communication bus, and a receiver 28 for receiving data via the shared communication bus from at least one other device (e.g., one or more boosted audio amplifier ICs for other audio channels) coupled to the shared communication bus. In some embodiments, transmitter 26 and receiver 28 may be combined into a single functional unit such that only a single pin of boosted audio amplifier IC 18 may be coupled to communication bus 20.

Although FIGS. 2 and 3 contemplate that audio IC 9 resides in a personal audio device, systems and methods described herein may also be applied to electrical and electronic systems and devices other than a personal audio device, including audio systems for use in a computing device larger than a personal audio device, an automobile, a building, or other structure.

Figure 4:
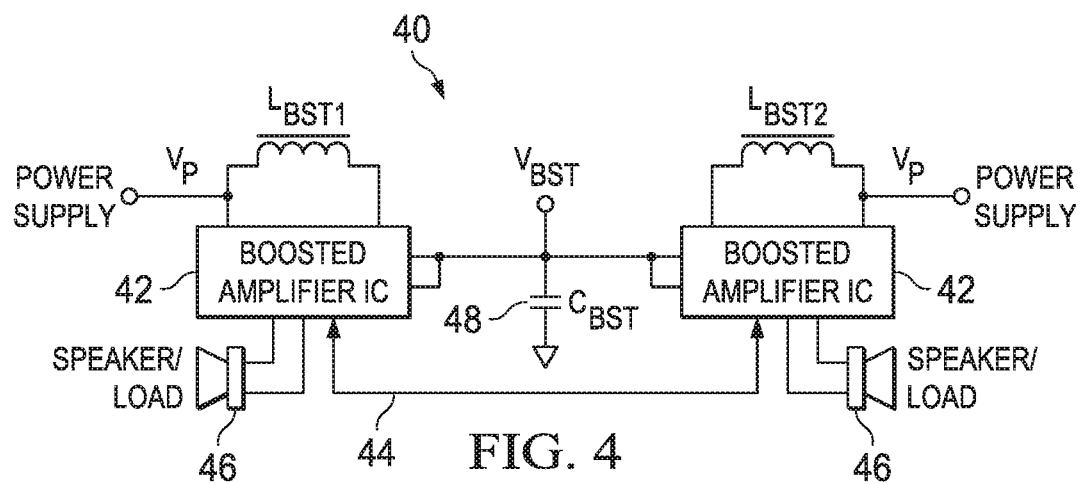
FIG. 4 illustrates a system comprising a plurality of distributed boosted amplifier ICs coupled together via a communications bus, in accordance with embodiments of the present disclosure.

FIG. 4 illustrates a system 40 comprising a plurality of distributed boosted amplifier ICs 42 (which may each implement a boosted audio amplifier IC 18) coupled together via a communications bus 44 (e.g., which may implement communication bus 20 depicted in FIG. 2), in accordance with embodiments of the present disclosure. Assuming each boosted amplifier IC 42 is sourced from the same power source (e.g., the same battery), each boosted amplifier IC 42 may be able to, via communications bus 44, determine the power consumption of the power source by each boosted amplifier IC 42 and accordingly manage the power consumption together in order to remain within a power consumption budget of the power source while dynamically managing how the consumed power is divided among the boosted amplifier ICs 42 in order to optimize power delivered to the respective loads 46 (e.g., speakers, headphones, and/or other transducers) of the boosted amplifier ICs 42 at a given time. With boosted amplifier ICs 42 aware of each other via communications bus 44, each boosted amplifier IC 42 may work in conjunction with the operation state of other boosted amplifier ICs 42, allowing boosted amplifier ICs 42 to functionally act together as a system instead of two independent devices.

In addition to linking boosted amplifier ICs 42 via communications bus 44, the outputs of the boost converters of each boosted amplifier IC 42 may be coupled together and may utilize a common energy storage device (or common energy storage devices) 48 having a capacitance $C_{BST}$, as shown in FIG. 4. Such an arrangement allows boosted amplifier ICs 42 together to operate as a multi-channel amplifier powered by a multi-phase boosted converter. Thus, the power delivery and functional capabilities of the boost converters of boosted amplifier ICs 42 can be combined to maximize output power delivery and efficiency under heaving loading conditions. Furthermore, under light loading conditions, one or more boost converters in the system 40 of a plurality of interconnected boosted amplifier ICs 42 may be disabled or put into a bypass mode in order to minimize overall power consumption of the boosted amplifier ICs 42.

Figure 5:
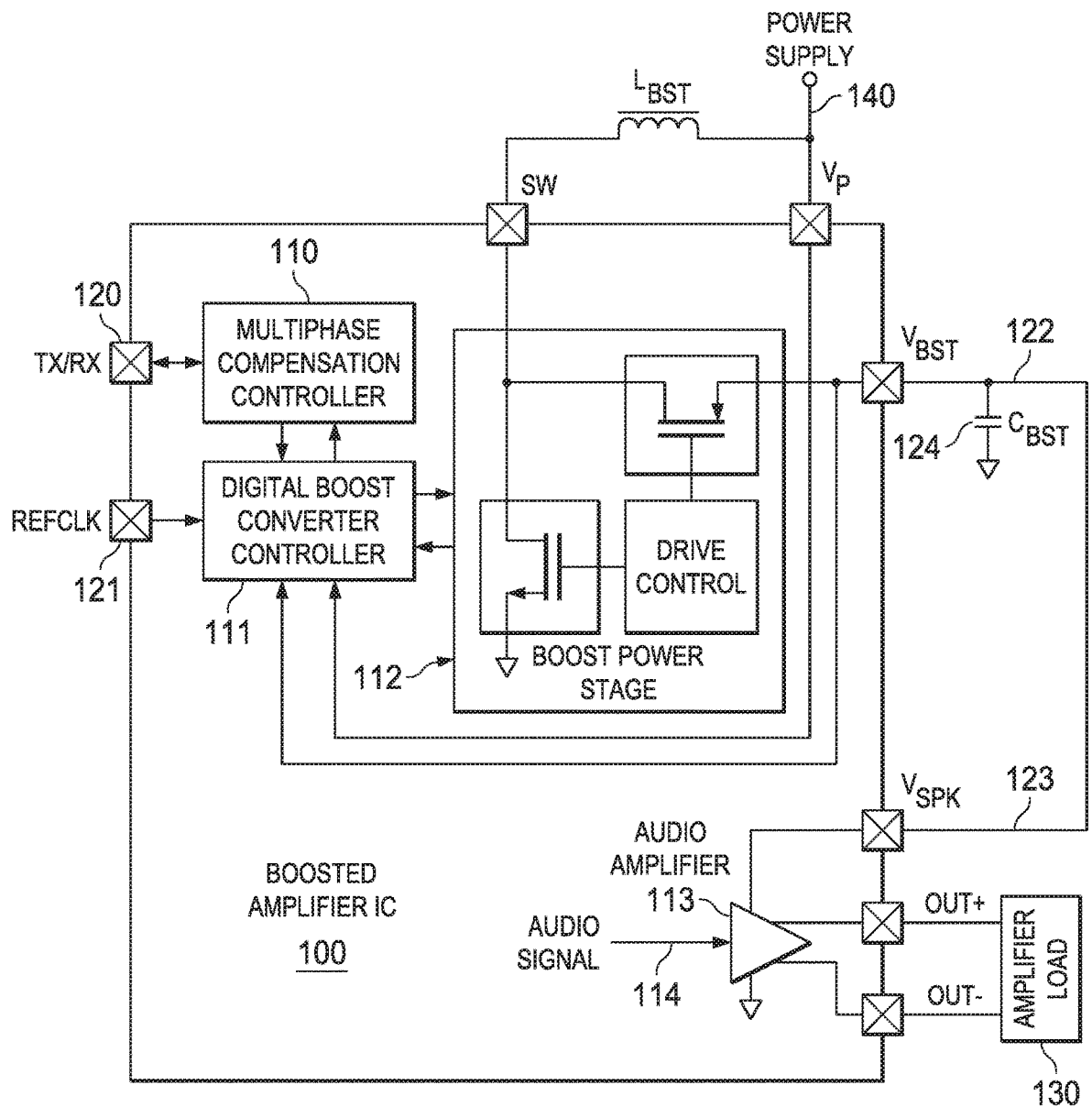
FIG. 5 illustrates a single boosted amplifier IC for use in the system of FIG. 4, in accordance with embodiments of the present disclosure.

FIG. 5 illustrates a single boosted amplifier IC 100 for use in system 40 of FIG. 4, in accordance with embodiments of the present disclosure. Boosted amplifier IC 100 as shown in FIG. 5 may be used to implement boosted amplifier IC 18 depicted in FIGS. 3 and 4. Boosted amplifier IC 100 may comprise a single, integrated circuit device where a boost converter and amplifier reside on the same physical die. The boost converter may be used to generate a higher supply voltage or intermediate voltage $V_{BST}$ than is available from a system's power supply 140 in order to allow audio amplifier 113 to deliver a higher output voltage swing and/or more power to the load than it could if just being supplied directly from the power supply 140.

Power supply 140 may comprise a voltage supply which provides electrical energy to the input of the boost converter as well as other functional blocks on the boosted amplifier IC 100. Particularly on portable devices, the power supply 140 is commonly shared among the multiple boosted amplifier ICs 100 that are present on the system. For example, in portable devices, power supply 140 is commonly (but not limited to) a single-cell lithium-ion battery with a voltage in the range of between 3.0 volts and 4.3 volts.

A bidirectional digital communications transmitter/receiver TX/RX 120 may allow boosted amplifier ICs 100 to exchange control and operating status information amongst the interconnected devices via a shared communications bus (e.g., communications bus 44). This communication exchange may allow individual boosted amplifier ICs 100 to act as a single amplifier system instead of as multiple individually controlled amplifiers. An example digital communication protocol for the shared communications bus is disclosed in U.S. patent application Ser. No. 15/226,197 filed on Aug. 2, 2016 entitled "Multi-Device Synchronization of Audio Devices" by May et al. (hereafter referred to as "the '197 application"). The '197 application is hereby incorporated by reference. A controller for TX/RX 120 may be used to couple together multiphase compensation controllers 110 of individual boosted amplifier ICs 100 to one another and thus synchronize operational states among boosted amplifier ICs 100.

REFCLK input 121 may be configured to receive an optional externally-sourced reference clock REFCLK common to all boosted amplifier ICs 100 being used in a system. Most commonly, this clock may be a system/master clock or a data clock which may be optionally used as a common phase and frequency reference when multiple boosted amplifier ICs 100 are operating at the same time. Reference clock REFCLK may be faster or slower than switching of a boost converter of a boosted amplifier IC 100. Accordingly, reference clock REFCLK may only act as a common reference in time.

Intermediate voltage $V_{BST}$ 122 may comprise a boost converter's generated output. Intermediate voltage $V_{BST}$ 122 man be static or signal variant.

Amplifier supply voltage $V_{SPK}$ 123 may comprise a power supply of audio amplifier 113. Depending on the design of boosted amplifier IC 100, amplifier supply voltage $V_{SPK}$ 123 power supply may be coupled to $V_{BST}$ 122 either internally within the boosted amplifier IC 100, or externally between pins on the boosted amplifier IC 100. If coupled internally on amplifier supply voltage $V_{SPK}$ 123, an input (e.g., pin) for amplifier supply voltage $V_{SPK}$ 123 may not exist.

Capacitor 124 having capacitance $C_{BST}$ may provide charge storage for the output of a boost converter output and the power supply input 123 having voltage $V_{SPK}$ of audio amplifier 113. A boost converter itself may not have the ability to store any charge for consumption by audio amplifier 113. Accordingly, capacitor 124 may be utilized as a charge storage element between the boost converter and audio amplifier 113.

A multiphase compensation controller 110 may allow the boost converters on each boosted amplifier IC 100 in an interconnected system to manage each other's operational state in order to allow them to be interconnected and effectively function as a single multiphase boost converter instead of a group of individual boost converters. Multiphase compensation controller 110 may be configured so that any one boosted amplifier IC 100 within the linked group may be configured and operate as a multiphase master. The remaining interconnected devices may then operate as multiphase slaves. In some embodiments, the multiphase compensation controller 110 that is configured to operate as the master device may reconfigure any of the multiphase slaves in order to: (1) maximize power delivery to the common node for voltage $V_{BST}$ when necessary, (2) optimize operating efficiency based on load demand, and (3) minimize power consumption under low or idle loading conditions on voltage $V_{BST}$.

In order to support multiple use cases, any multiphase compensation controller 110 within an interconnected system of boosted amplifier ICs 100 may be configured to operate as a multiphase master or multiphase slave.

A multiphase master may manage one or more of the following tasks for a system of interconnected boosted amplifier ICs 100:

Balancing and managing power delivery from each active boost converter to the combined supply having voltage $V_{BST}$. A multiphase master controller may be in charge of determining how power delivery is shared among multiple boost converters linked together. Without this power delivery management, it is possible that one boost converter may provide a bulk of the power to the system while any other active boost converters may be producing minimum power. This situation would reduce system efficiency and possibly create thermal issues with one boosted amplifier IC 100 producing a majority of the power delivered via voltage $V_{BST}$. Power consumption limits of each boost converter and a combined multi-device system may either be fixed based on hardware restrictions, self-derived using an adaptable brownout detection, and/or manually configured by an external source.

Identification and/or confirmation of a number of available boost converters on a linked multiphase system via the shared communications bus. The multiphase master may be responsible for identifying the number of boost converters present on a system and their local configuration parameters, such as a peak current limit or power delivery capabilities. This identification and/or confirmation may allow the multiphase master to identify whether all of the linked boost converters can be handled equivalently or if any of the coupled boost converter devices have special limitations. For example, a system may have two or more different types of boosted amplifier ICs 100 (e.g., one type capable of delivering 5 watts of power and another type capable of delivering 3 watts of power). The multiphase master would need to be able to recognize that the different boosted amplifier ICs 100 do not have matched capabilities and would have to compensate its load balancing to accommodate the differences. Alternatively, a user of another subsystem in a device may manually configure the master and slave multiphase compensation controllers 110 (e.g., by using a different communications bus such as I2C, SPI, SoundWire, etc.) in order to reduce the bandwidth requirements on the shared communications bus.

Determining a switching phase configuration of each active boost converter in an interconnected system of boosted amplifier ICs 100. The number of active switching phases may increase or decrease based on loading demands of voltage $V_{BST}$. Management of this switching phase configuration may vary based on user configuration or a number of active boost converters present. A boost converter on the linked network of boosted amplifier ICs 100 may have a fixed switching phase or may change phases based on a number of active boost converters switching at any given point in time. For example, if one of the boosted amplifier ICs 100 linked together is powered down, a master multiphase compensation controller 110 may recognize that the number of available boost converters has been reduced by one and may adapt accordingly.

Determining which and how many boost converters need to be active or inactive based on the total loading on voltage $V_{BST}$. If more power is required than is available from a current operating configuration, a multiphase master may enable additional boost converters to contribute to power generation on voltage $V_{BST}$. If power demands on voltage $V_{BST}$ decrease, the multiphase master may disable one or more slave boost converters to reduce system power consumption overhead.

Enforcing system level configurations assigned by a user such as (but not limited to): setting of a target boost voltage $V_{BST}$, setting of a target voltage soft-ramping, setting of inrush or back-powering current limits, setting of operational current consumption limits from the power supply, setting of power budgeting in low battery or brownout prevention states, setting of loop bandwidth requirements, setting of allowable phase relationships, setting of an allowable number of active and switching boost converters, setting of thresholds at which the number of active boost converters increase or decrease, etc.

The ability to reconfigure any one of the slave devices on the shared communications bus in order to achieve the combined system level power management goals as configured by a user or required by power management targets of multiphase compensation controller 110 of the multiphase master.

Providing data regarding voltage $V_{BST}$ to be used as a reference or a correction factor for voltage $V_{BST}$ for each slave device on the shared communications bus use.

Controlling each boost converter's switching phase alignment with or without the aid of an external reference clock (e.g., reference clock REFCLK).

A multiphase compensation controller 110 can coexist with any other subsystem which adaptively controls peak or average current limits for purposes of power management. An example of such a system for adaptively controlling peak or average current limits is disclosed in U.S. patent application Ser. No. 15/229,616 entitled "Adjusting Peak Inductor Current to Limit Maximum Supply Input Current" to May et al. (hereafter referred to as "the '295 patent application"). The '295 patent application is hereby incorporated by reference.

The coupled slave devices are capable of providing any of the (previously stated) requested information to the master device as well as receiving and responding to any operational state changes, re-configurations, or instructions communicated by the multiphase master.

Digital boost converter controller 111 may manage a control loop for operation of a boost converter, including current control feedback, voltage control feedback, switching modes of operation (e.g., Continuous Conduction Mode (CCM) or Discontinuous Conduction Mode (DCM)), target values for voltage $V_{BST}$, current limits, soft ramping, current and voltage protection, transitional operational state control, and/or any other operational parameters of a boost converter within boosted amplifier IC 100. Depending on the architecture, various portions of digital boost converter controller 111 may be implemented digitally and/or in analog circuitry.

As shown in FIG. 5, boost converter power stage 112 may comprise a drive control for switches of the boost converter, a boost field-effect transistor (FET) between a switching node SW and a ground voltage, and a bypass field-effect transistor between the switching node SW and node for voltage $V_{BST}$. The bypass FET may include an intrinsic body diode, such that when the bypass FET is disabled (e.g., turned off, deactivated, etc.), such body diode may allow conduction from switching node SW to the node for voltage $V_{BST}$ but may block current from flowing back from the node for voltage $V_{BST}$ to switching node SW. Boost converter power stage 112 may thus allow a voltage higher than the power supply voltage $V_P$ to exist on the node for voltage $V_{BST}$.

Audio amplifier 113 may reproduce an amplified version of an audio signal 114, and may provide power to an amplifier load 130. In integrated boosted amplifiers, audio amplifier 113 is typically a Class H amplifier, but in other embodiments audio amplifier 113 may include a Class A, Class A/B, or other type of amplifier. Audio amplifier 113 may use voltage $V_{BST}$ as its power supply input voltage $V_{SPK}$. The connection between voltage $V_{BST}$ and voltage $V_{SPK}$ may be internal to the IC or be routed out and back through external pins of boosted amplifier IC 100, as shown in FIG. 5.

Audio signal 114 may be a signal provided to the input of the audio amplifier 113. Audio signal 114 may be provided from an external source, or generated internally by boosted amplifier IC 100 or a signal processing unit within the boosted amplifier IC 100.

Although much of the discussion in this disclosure contemplates boosted amplifier IC 100 including an audio amplifier, the systems and methods described herein could also be applied for amplifying signals in other applications besides audio signals, including but not limited to haptics or ringtone vibration.

Although on a boosted amplifier IC 100, both the boost converter and amplifier may be present on the same die, they are conceptually shown separately in some of the following examples for illustrative purposes. For example, for descriptive clarity the examples shown in FIGS. 6-9, the boost converters and amplifiers for a plurality of respective boosted amplifier ICs are shown separately. In the examples depicted in FIGS. 6-9, when a boost converter or amplifier is active and either producing or consuming current (respectively), they are shown as being electrically coupled to intermediate voltage $V_{BST}$. When a boost converter or amplifier is inactive, it is shown to be disconnected from intermediate voltage $V_{BST}$. This disconnection may not be representative of an actual physical disconnection but only to indicate an active or an inactive state of the three interconnected boosted amplifier ICs 100 depicted in the example systems of FIGS. 6-9. Thus, the amount of capacitance $C_{BST}$ of capacitor 44 may not change for any of the examples, as in an actual system such capacitor 44 may always be coupled to the shared intermediate voltage $V_{BST}$.

Figure 6:
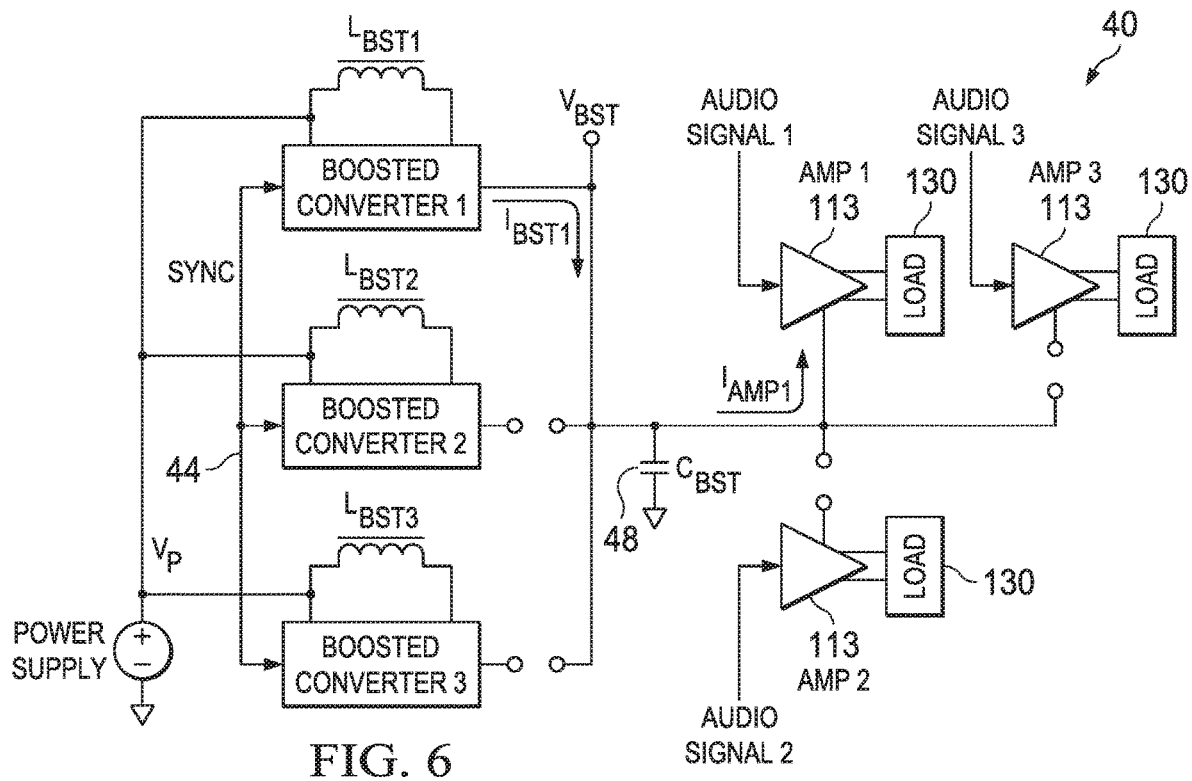
FIG. 6 illustrates a system comprising three distributed boosted amplifier ICs coupled together via a communications bus in a condition wherein one boost converter and one amplifier of the system are active, in accordance with embodiments of the present disclosure.
Figure 7:
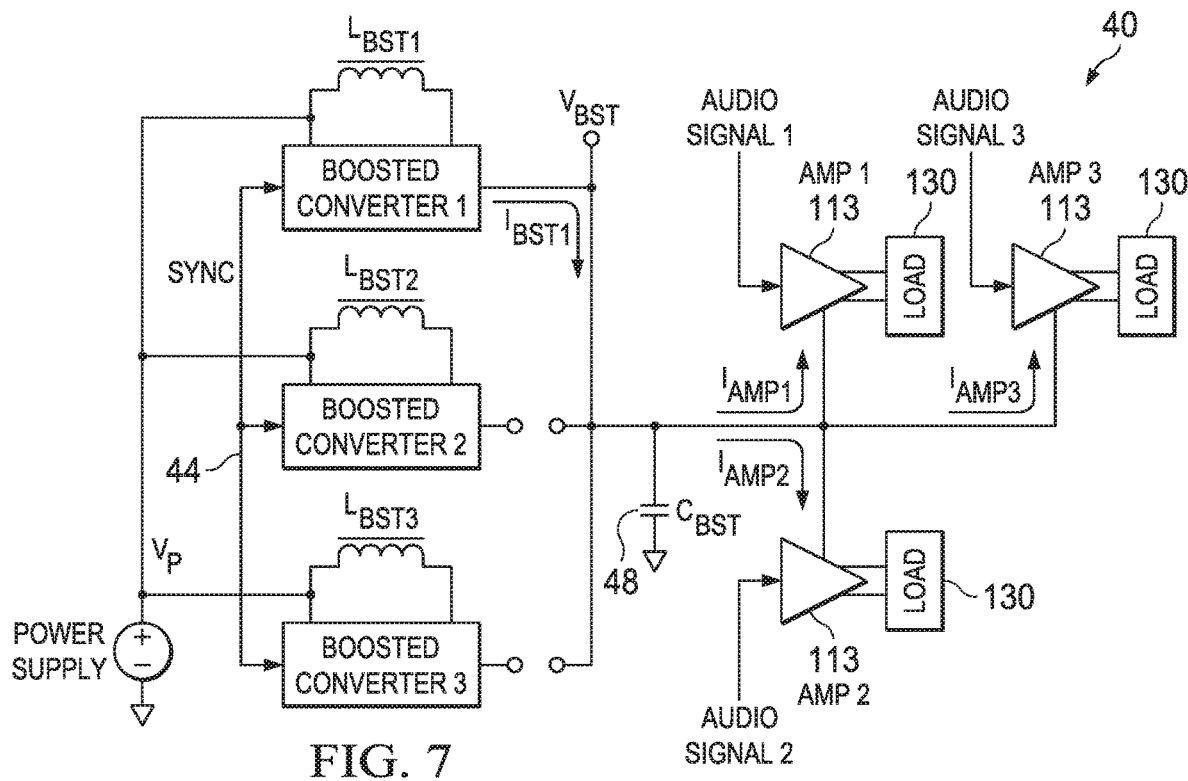
FIG. 7 illustrates a system comprising three distributed boosted amplifier ICs coupled together via a communications bus in a condition wherein one boost converter and three amplifiers of the system are active, in accordance with embodiments of the present disclosure.

FIG. 6 illustrates a system 40 comprising three distributed boosted amplifier ICs 100 (e.g., Boosted Converters 1, 2, and 3) coupled together via a communications bus 44 in a condition wherein one boost converter and one amplifier 113 of system 40 are active, in accordance with embodiments of the present disclosure. FIG. 7 illustrates the same system 40 in a condition wherein one boost converter (e.g., Boost Converter 1) and three amplifiers 113 of system 40 are active, in accordance with embodiments of the present disclosure. The condition shown in FIG. 7 may be a low-loading condition whereby the combined loading demands of amplifiers 113 (e.g., the aggregate current $i_{AMP1}+i_{AMP2}+i_{AMP3}$ demanded by amplifiers 113) are low enough to be met by a single boost converter (e.g., $i_{BST1}$). When such a low-loading condition occurs, system 40 may only have a need for Boost Converter 1, and thus Boost Converter 2 or Boost Converter 3 need not be switching and active.

Figure 8:
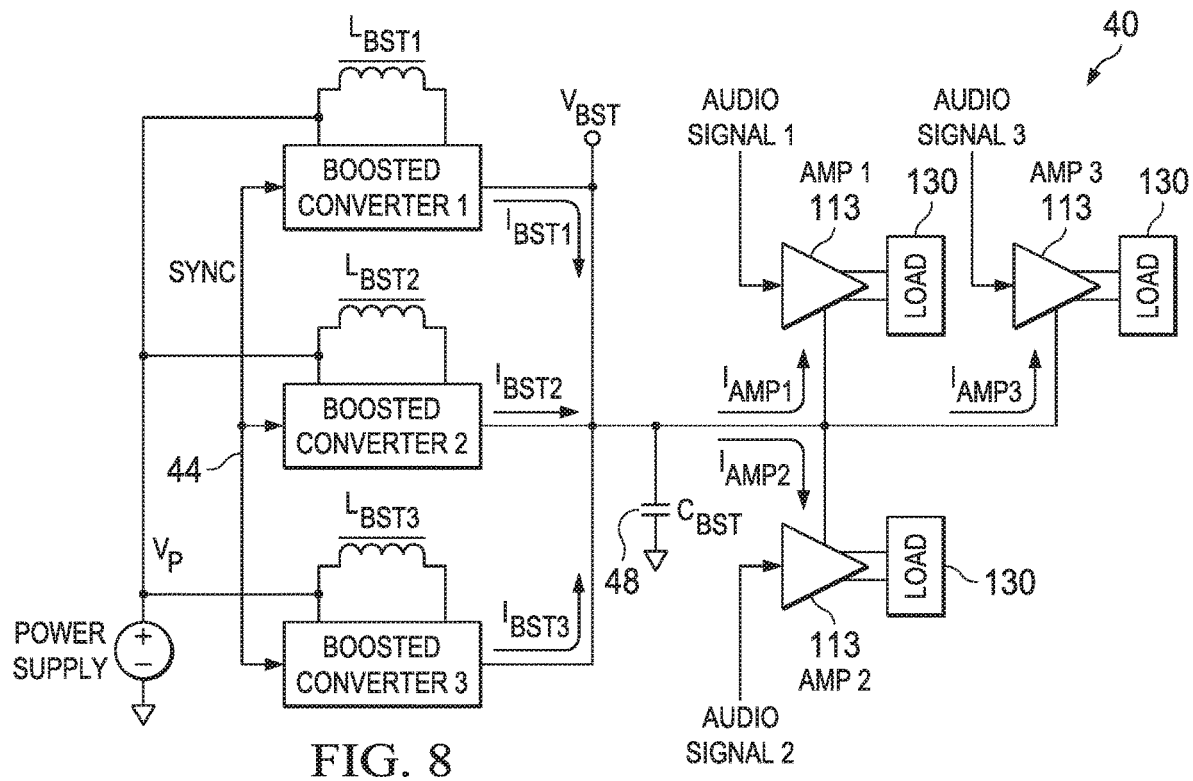
FIG. 8 illustrates a system comprising three distributed boosted amplifier ICs coupled together via a communications bus in a condition wherein three boost converters and three amplifiers of the system are active, in accordance with embodiments of the present disclosure.

FIG. 8 illustrates the system 40 wherein three boost converters (e.g., Boosted Converters 1, 2, and 3) and three amplifiers 113 of the system are active, in accordance with embodiments of the present disclosure. The condition shown in FIG. 8 may be one in which amplifiers 113 are consuming enough aggregate current such that all three of the boost converters are required to provide power to the combined load. It may not be necessary for all amplifiers 113 to have equivalent loading, but that amplifiers 113 produce enough combined loading (e.g., the aggregate current $i_{AMP1}+i_{AMP2}+i_{AMP3}$ demanded by amplifiers 113) such that a multiphase compensation controller of a multiphase master device determines that the three phases of the linked boost converter network are required to be active and providing current (e.g., $i_{BST1}+i_{BST2}+i_{BST3}$) to the shared intermediate voltage $V_{BST}$.

Figure 9:
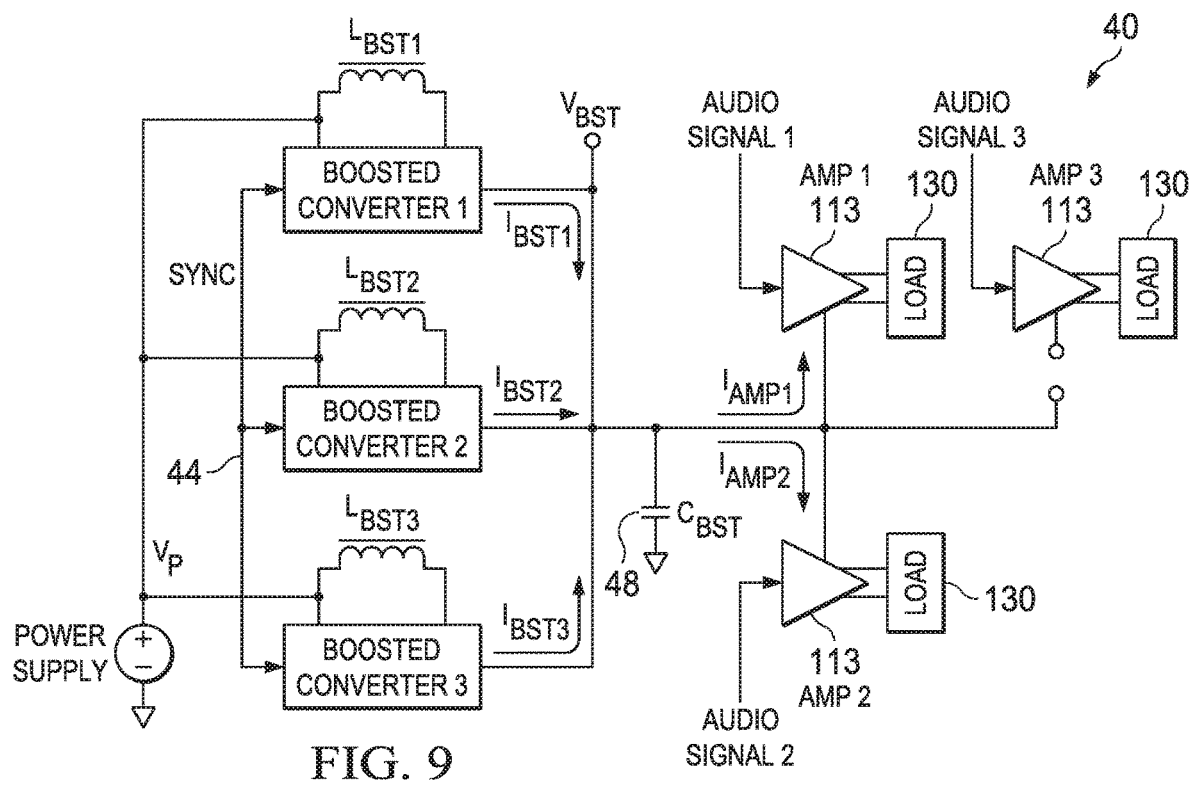
FIG. 9 illustrates a system comprising three distributed boosted amplifier ICs coupled together via a communications bus in a condition wherein two boost converters and three amplifiers of the system are active, in accordance with embodiments of the present disclosure.

FIG. 9 illustrates the same system 40 wherein two boost converters and three amplifiers 113 of the system are active, in accordance with embodiments of the present disclosure. In the condition shown in FIG. 9, only two amplifiers 113 are active and consuming power, but the combined power of such two amplifiers is large enough to require power delivery from three boost converters.

In example system 40 shown above, a number of boost converters actively providing power may be based on loading upon the node of intermediate voltage $V_{BST}$, and may not be dependent on the number of amplifiers 113 active. Depending on the loading demands of the amplifiers 113 and/or system configurations, there could be any combination of the boost converters and amplifiers 113 active at any given point in time. A boost converter needs only to be aware of its loading demands on intermediate voltage $V_{BST}$ and to provide this information to multiphase compensation controller 110. In turn, a multiphase compensation controller 110 may establish the number of boost converters which need to be active for a given load on intermediate voltage $V_{BST}$.

Although three boost converter/amplifier pairs are shown for example system 40 shown in FIGS. 6-9, the actual number of boosted amplifier ICs 100 is not limited to three. An actual system may have between 2 and "N" boosted amplifier ICs 100 in which "N" is an integer that is three or greater and with the "N" number only being limited by the ability of shared communications bus 44 or the physical ability to interconnect a number of boosted amplifier ICs 100 together and/or fit them in a form factor of an end device.

Some of the examples below may describe continuous and synchronous switching of boost converters. When a boost converter's switching node SW is enabled and actively switching, either the boost FET is on or the bypass FET is enabled (e.g., activated, turned on, etc.) at one point in time. If the switching node SW of a given boost converter is disabled, there is no active switching and the switching node SW approximates the power supply voltage $V_P$, as the switching node SW is coupled to the power supply voltage $V_P$ through a corresponding power inductor $L_{BST}$.

For purposes of the examples described in FIGS. 10-14, four linked boost converters of four respective boosted amplifier ICs are used. The timing diagrams of FIGS. 10-14 depict how multiple boost converters may be switched in and out of a linked system, with the switching phase relationships among the boost converters dynamically managed (e.g., by a multiphase compensation controller 110 of a multiphase master device). This dynamic management allows the system to support a wide range of loading while maintaining high efficiency and minimal power consumption overhead.

Figure 10:
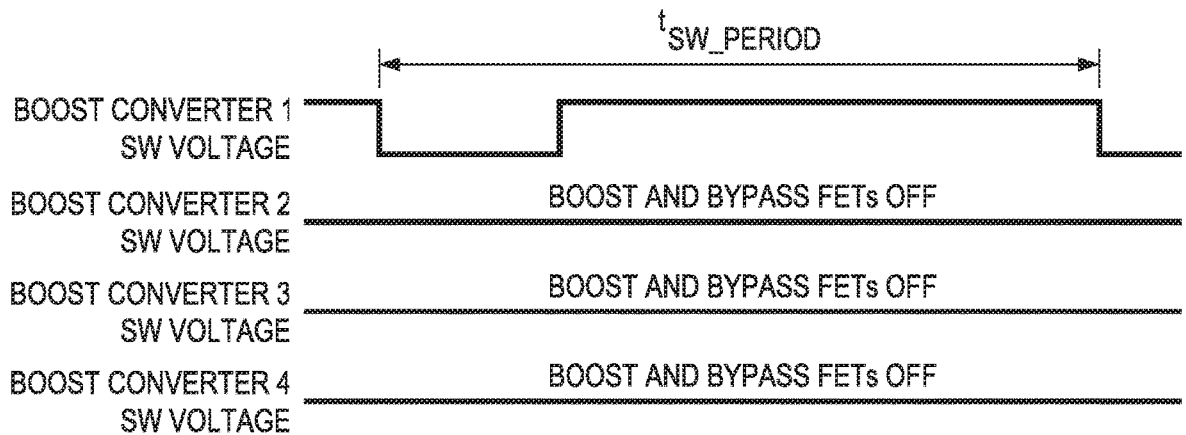
FIG. 10 illustrates example waveforms of switching nodes of a system of linked boost converters of respective boosted amplifier ICs having one active boost converter, in accordance with embodiments of the present disclosure.

In FIGS. 10-14, a switching voltage at switching node SW of each boost converter is shown. When the switching voltage of a switching node SW is low, the boost FET of the respective boost converter is enabled, and when the switching voltage of the switching node SW is high, the bypass FET of the respective boost converter is enabled. FIG. 10 depicts a configuration in which, of the four linked boost converters of four boosted amplifier ICs 100, only boost converter 1 is actively switching at a rate of $1/t_{SW\_PERIOD}$.

Figure 11:
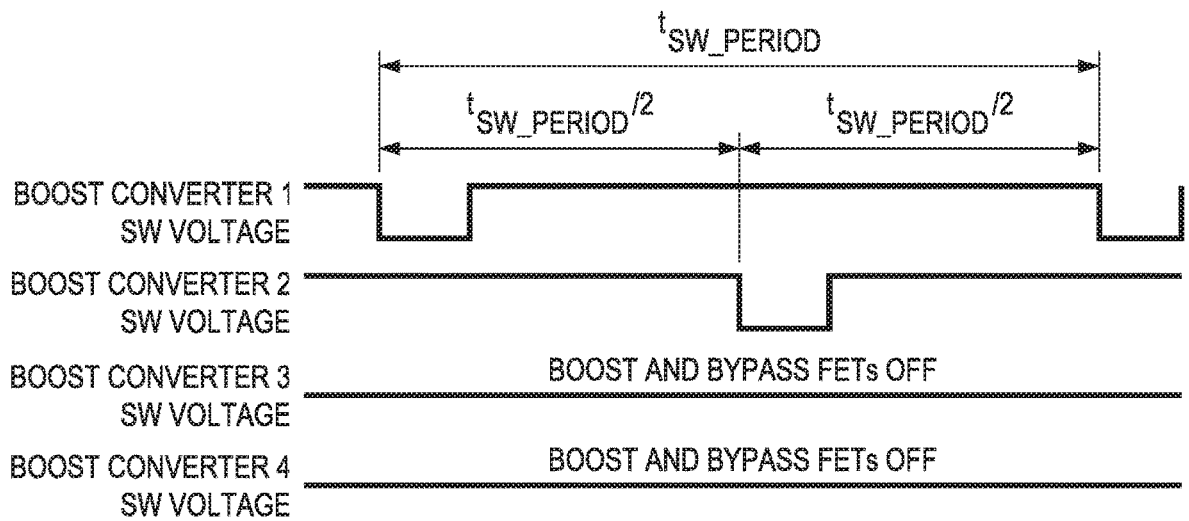
FIG. 11 illustrates example waveforms of switching nodes of a system of linked boost converters of respective boosted amplifier ICs having two active boost converters, in accordance with embodiments of the present disclosure.

FIG. 11 depicts a configuration in which, of the four linked boost converters of four boosted amplifier ICs 100, both boost converter 1 and boost converter 2 are actively switching at a frequency of $1/t_{SW\_PERIOD}$. The time period $t_{SW\_PERIOD}$ may be split evenly between the boost FET of boost converter 1 being on and the boost FET of boost converter 2 being on, producing a combined switching frequency of $2/t_{SW\_PERIOD}$ as a system. Splitting the period $t_{SW\_PERIOD}$ in half may maximize the effective peak-to-peak ripple current reduction seen by the power supply generated power supply voltage $V_P$.

Figure 12:
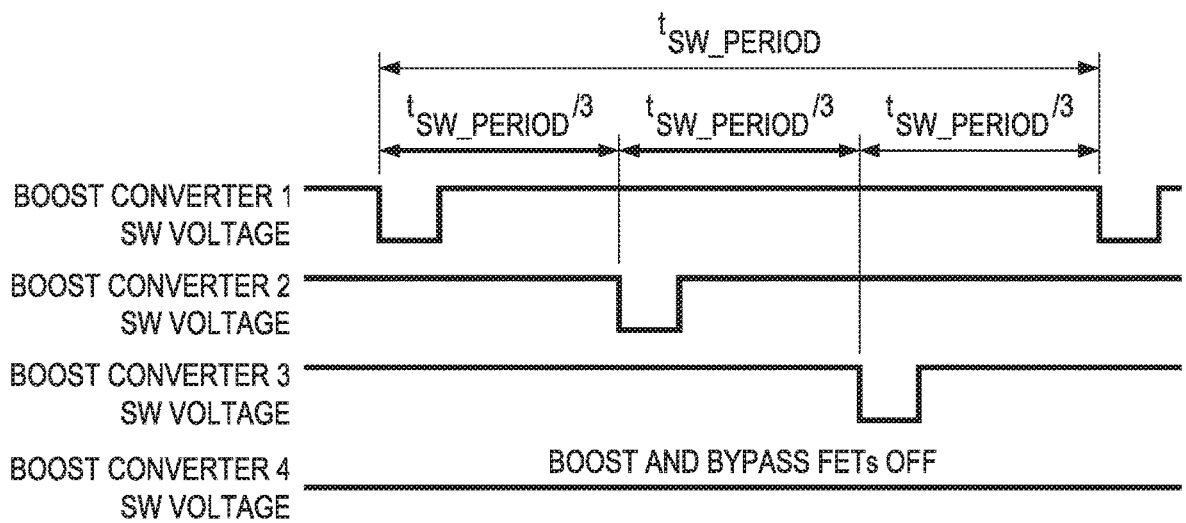
FIG. 12 illustrates example waveforms of switching nodes of a system of linked boost converters of respective boosted amplifier ICs having three active boost converters, in accordance with embodiments of the present disclosure.

FIG. 12 depicts a configuration in which, of the four linked boost converters of four boosted amplifier ICs 100, three active boost converters (boost converter 1, boost converter 2, and boost converter 3) are each actively switching at an individual frequency of $1/t_{SW\_PERIOD}$, but producing a combined effective frequency of $3/t_{SW\_PERIOD}$ as is seen by the power supply voltage $V_P$ and the load of intermediate voltage $V_{BST}$.

Figure 13:
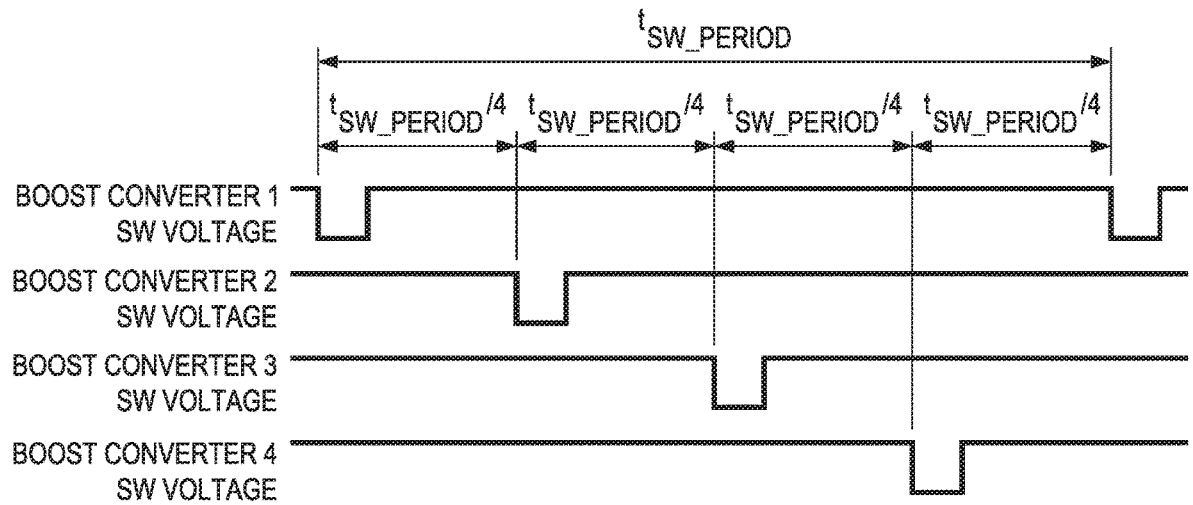
FIG. 13 illustrates example waveforms of switching nodes of a system of linked boost converters of respective boosted amplifier ICs having four active boost converters, in accordance with embodiments of the present disclosure.
Figure 14:
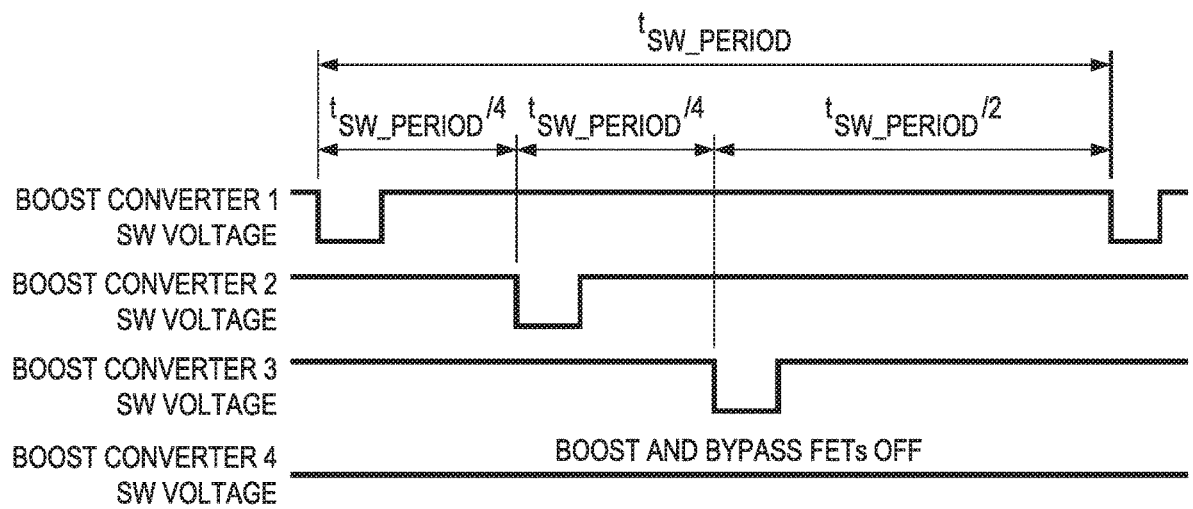
FIG. 14 illustrates example waveforms of switching nodes of a system of linked boost converters of respective boosted amplifier ICs having three active boost converters, in accordance with embodiments of the present disclosure.

FIG. 13 depicts a configuration in which, of the four linked boost converters of four boosted amplifier ICs 100, all four active boost converters (boost converter 1, boost converter 2, boost converter 3, and boost converter 4) are each actively switching at an individual frequency of $1/t_{SW\_PERIOD}$, but producing a combined effective frequency of $4/t_{SW\_PERIOD}$ as is seen by the power supply voltage $V_P$ and the load of intermediate voltage $V_{BST}$.

In some embodiments, if a system has a particular sensitivity to power supply ripple at a particular frequency, switching phases may be skipped and/or phase locations may be configured to remain static. In other words, if there is a system sensitivity with a switching period $t_{SW\_PERIOD}/3$, a multiphase compensation controller 110 may be configured to jump from one-phase operation (e.g., as shown in FIG. 10) to two-phase operation (e.g., as shown in FIG. 11) and then to four-phase operation (e.g., as shown in FIG. 13), skipping three-phase operation (e.g., as shown in FIG. 12) to avoid operation where there may be a system-level sensitivity to that particular switching frequency period.

In these and other embodiments, the various phase positions may also be locked into specific timing locations. In FIG. 12, the three phases are shown to be active at a period of $t_{SW\_PERIOD}/3$. In FIG. 13, the four phases are shown to be active at a period of $t_{SW\_PERIOD}/4$. However, if there is a system sensitivity at $t_{SW\_PERIOD}/3$, an alternative phasing method such as that shown in FIG. 14 may maintain each boost converter's phase in a fixed location relative to boost converter 1. Under this alternative phasing method, switching energy around $t_{SW\_PERIOD}/3$ may be avoided by switching at $t_{SW\_PERIOD}/4$ for boost converters 1 and 2, and switching at $t_{SW\_PERIOD}/2$ for boost converter 3 in order to avoid the system sensitivity at $t_{SW\_PERIOD}/3$.

Figure 15A:
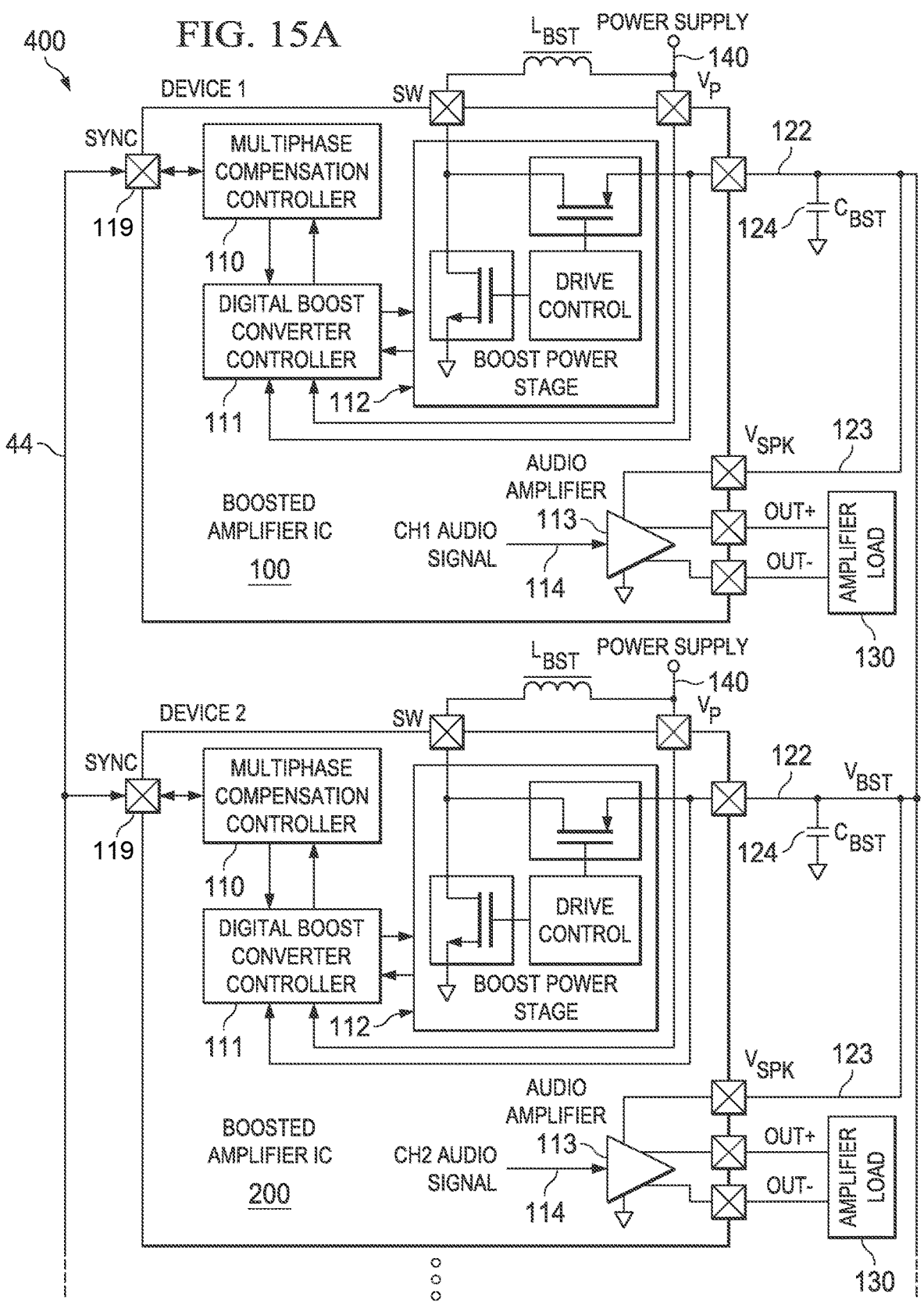
FIGS. 15A and 15B illustrate a multi-boost converter phase system comprising a plurality of distributed boosted amplifier ICs coupled together via a communications bus, in accordance with embodiments of the present disclosure.
Figure 15B:
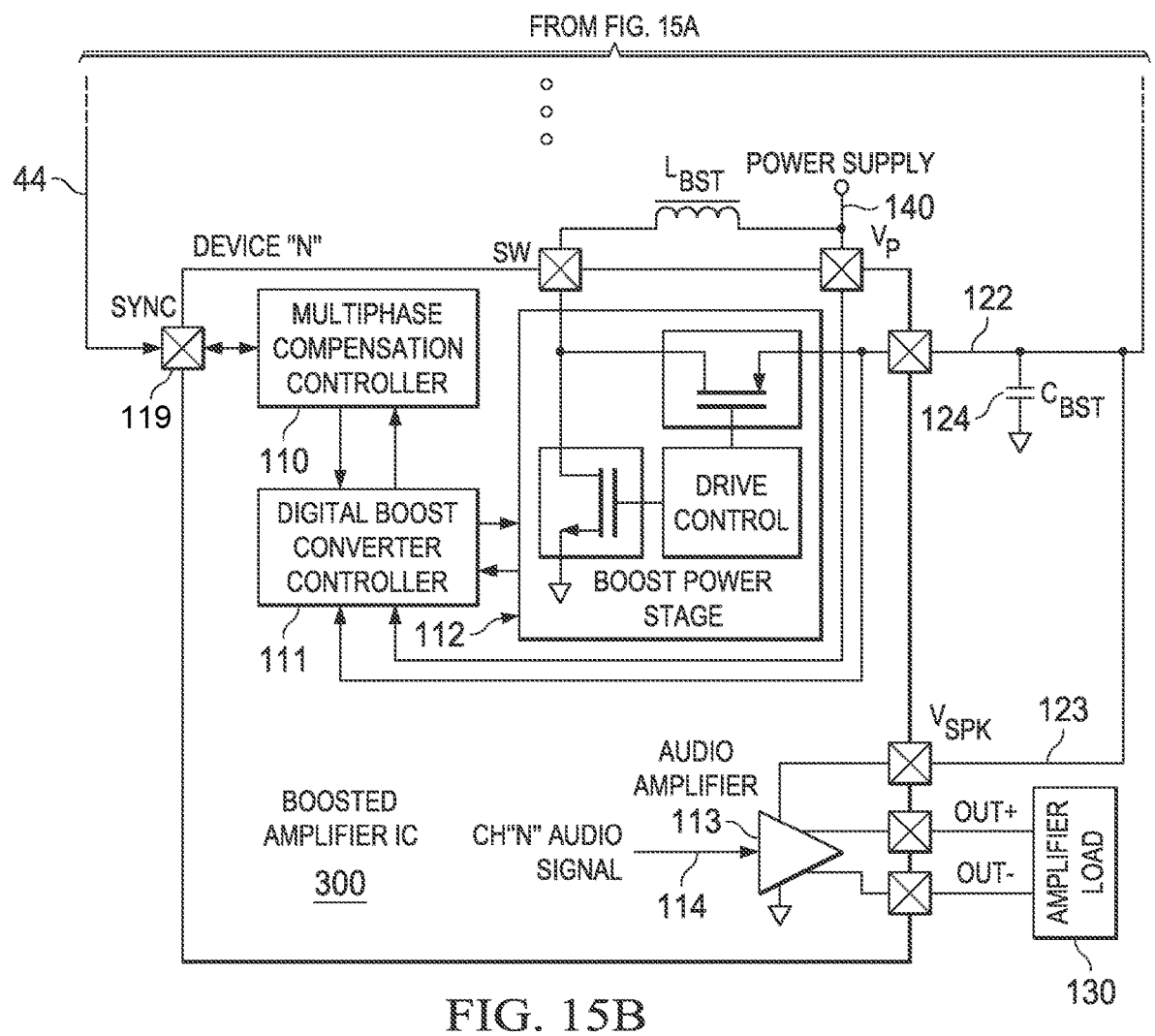

FIGS. 15A and 15B illustrate a multi-boost converter phase system 400 comprising a plurality of distributed boosted amplifier ICs 100, 200, and 300 coupled together via a shared communications bus 44, in accordance with embodiments of the present disclosure. Multiphase amplifier system 400 may include a plurality of boosted amplifiers ICs (e.g., boosted amplifiers 100, 200, 300, etc.) coupled to intermediate voltage $V_{BST}$ wherein the plurality of boosted amplifiers share information relating to at least one of the following: the intermediate voltage $V_{BST}$; a current drawn from the supply voltage $V_P$ by each of the boosted amplifiers (e.g., each inductor current through the respective inductor $L_{BST}$); the current delivered to intermediate voltage $V_{BST}$ by each of the boosted amplifiers (e.g., each boost converter's output current $i_{BST}$); timing information of each of boosted amplifier ICs (e.g., such as the examples shown in the timing diagrams of FIGS. 10 to 14); a target current for a boost converter of a boosted amplifier IC; and/or a control parameter for a boost converter of a boosted amplifier IC.

Such information may be shared among multiphase compensation controllers 110 of various boosted amplifier ICs via a shared communications bus 44 using digital signaling. Thus, operations of the boosted amplifier ICs may be managed and controlled in a desired manner by such a multiphase compensation controller 110 that is coupled to the plurality of the boosted amplifier ICs. At least one of the boosted amplifier ICs may operate as a multiphase master device while at least one of the boosted amplifier ICs may operate as a multiphase slave device. The multiphase master device may manage at least one of the following: 1) determining an available number of active boosted amplifiers; 2) managing respective power delivery contributions from the active boosted amplifiers to provide the intermediate voltage; 3) determining operations of the active boosted amplifiers based on a load on the intermediate voltage; 4) enforcing assigned system level configurations; 5) activating and deactivating boosted amplifier contributions; 6) determining relative phase operation of the active boosted amplifiers; 7) enforcing relative phase operation of the active boosted amplifiers; and 8) optimizing efficiency.

FIGS. 15A and 15B show a block-level interconnect example system 400 wherein a total of "N" boosted amplifier ICs may be connected together using a shared communications bus via each boosted amplifier IC's SYNC pin 119 and with each boosted amplifier IC's boost converter output supply voltage coupled together at the node of intermediate voltage $V_{BST}$. In the example shown in FIGS. 15A and 15B, a capacitor 124 having capacitance $C_{BST}$ is shown locally to each boosted amplifier IC. However, this localization of capacitance to each device may vary based on implementation. For example, some capacitance on the node of intermediate voltage $V_{BST}$ may be local to each boosted amplifier IC, and some may be at a shared centralized location. Depending on the placement of each boosted amplifier IC and system requirements, such distribution of capacitance may vary.

Figure 16A:
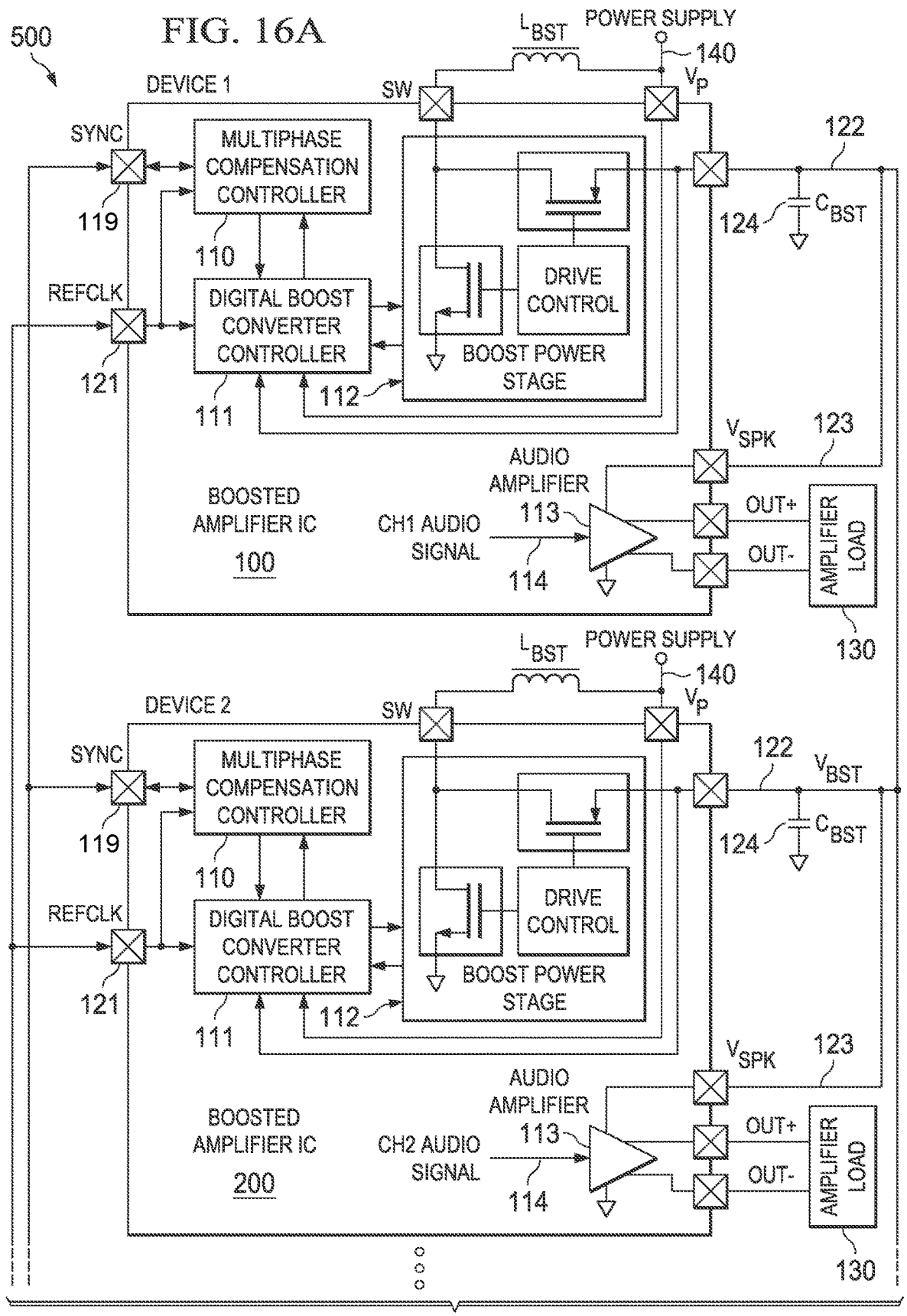
FIGS. 16A and 16B illustrate a multi-boost converter phase system comprising a plurality of distributed boosted amplifier ICs coupled together via a communications bus and having a shared reference clock, in accordance with embodiments of the present disclosure.
Figure 16B:
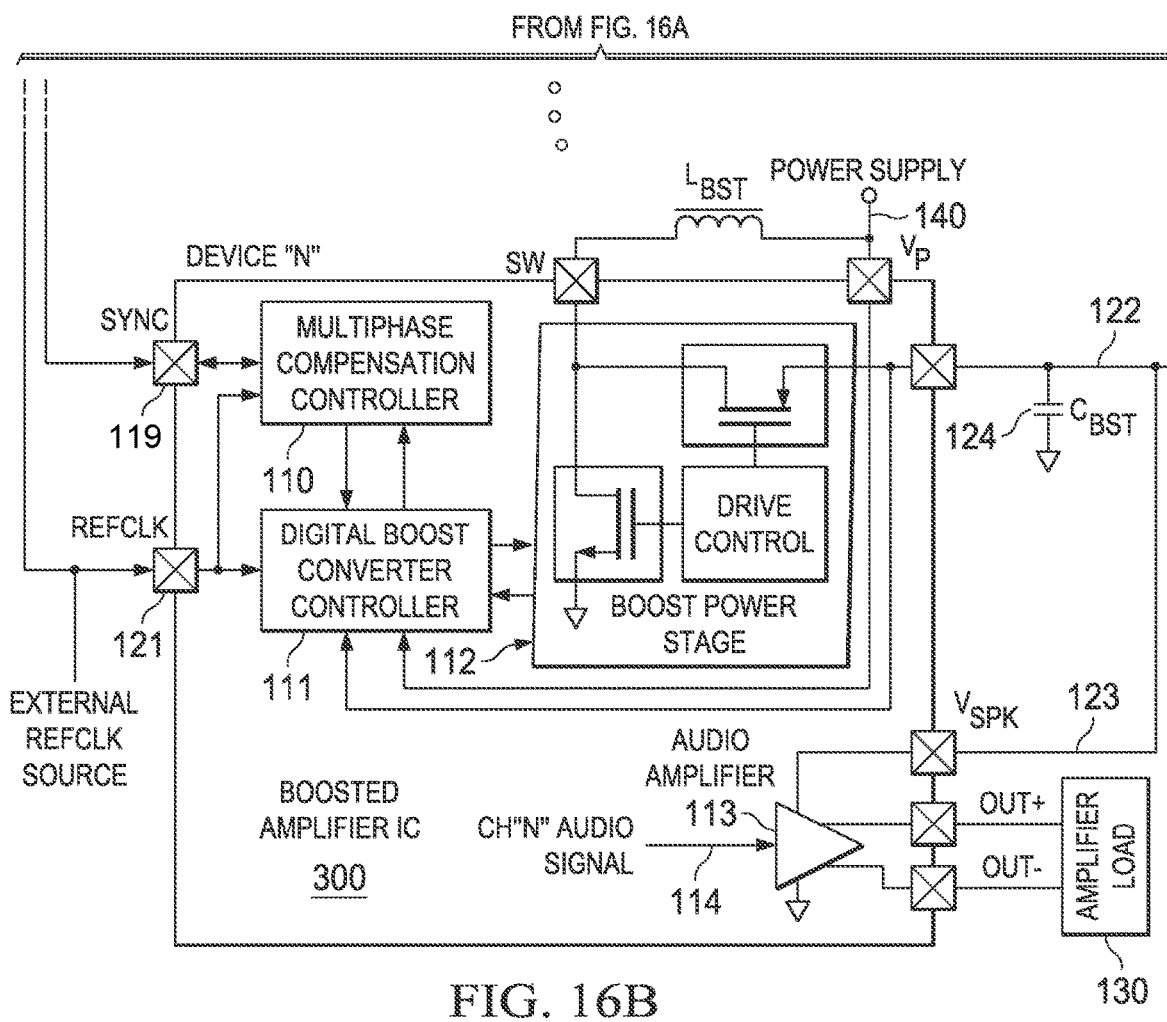

FIGS. 16A and 16B illustrate a multi-boost converter phase system 500 comprising a plurality of distributed boosted amplifier ICs 100, 200, and 300 coupled together via a shared communications bus 44 and having a shared reference clock REFCLK, in accordance with embodiments of the present disclosure. Example system 500 may differ from example system 400 of FIGS. 15A and 15B in that common reference REFCLK receive at clock input 121 of each boosted amplifier IC may be leveraged for the purposes of increasing a phase relationship accuracy among the boosted amplifier ICs. Reference clock REFCLK may operate at a slower, faster, or equivalent frequency relative to the boost converters' output switching rate (e.g., $1/t_{SW\_PERIOD}$). The purpose of reference clock REFCLK may be to produce a common point in time that all boosted amplifier ICs may utilize. The boosted amplifier ICs of system 500 may each be running asynchronously or with a different internal clock phase relative to each other, potentially requiring a common reference point in time to establish and maintain a fixed phase relationship. An alternative to providing an external reference clock REFCLK would be to embed a periodic "zero time" pulse on shared communications bus 44, although such alternative may reduce the throughput of shared communications bus 44. Although a reference clock REFCLK may exist on a given system, it does not necessarily need to be utilized by the multiphase compensation controller 110 or a digital boost converter controller 111 if it is not being utilized as a common reference point in time.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A system comprising:
   a circuit having a power converter and an amplifier, wherein the power converter is configured to:
   generate an intermediate voltage;
   provide the intermediate voltage as an amplifier supply voltage to the amplifier; and
   share the intermediate voltage with one or more additional circuits external to the circuit, wherein at least one of the one or more additional circuits comprises a second power converter and a second amplifier and the power converter and the second power converter are configured to generate the intermediate voltage for sharing among the amplifier and the second amplifier.

2. The system of claim 1, wherein the circuit comprises a single integrated circuit comprising the power converter and the amplifier.

3. The system of claim 1, wherein the system comprises at least one of a receiver and a transmitter for communication of information between the circuit and the one or more additional circuits via a shared communications bus.

4. The system of claim 3, wherein the information comprises at least one of:
   a magnitude of the intermediate voltage;
   a current drawn by a power converter supply voltage that supplies electrical energy to the power converter;
   a current delivered by the power converter to the amplifier and a second circuit of the one or more additional circuits;
   a target current for a power converter of the second circuit;
   a control parameter for the power converter of the second circuit; and
   timing information associated with the amplifier and the second circuit.

5. The system of claim 4, wherein the timing information comprises phase information or frequency information of the power converter of the second circuit.

6. The system of claim 3, wherein each of the one or more additional circuits comprise a respective power converter and a respective amplifier, the power converter and each respective power converter configured to generate the intermediate voltage for sharing among the amplifier and each respective amplifier.

7. The system of claim 6, wherein the circuit comprises a control subsystem configured to manage and control operation of the amplifier, and the respective power converters and respective amplifiers of each of the one or more additional circuits.

8. The system of claim 7, wherein the control subsystem is configured to balance and manage power delivery from the power converter and each respective power converter in accordance with a desired power control setting.

9. The system of claim 8, wherein the control subsystem is configured to balance and manage power delivery from the power converter and each respective power converter by selectively activating and deactivating the power converter and each respective power converter based on combined loads of the amplifier and the respective amplifiers.

10. The system of claim 8, wherein the control subsystem is configured to balance and manage power delivery from the power converter and each respective power converter by selectively activating and deactivating the power converter and each respective power converter based on the control parameter.

11. The system of claim 7, wherein the control system is configured to perform at least one of the following:
    determine a total number of the power converter and the respective power converters;
    manage individual power delivery from each of the power converter and the respective power converters;
    control operations of the amplifier and the respective amplifiers based on the intermediate voltage and individual output loads of the amplifier and the respective amplifiers; and
    control relative phase operations of the power converter and the respective power converters.

12. The system of claim 6, wherein the power converter and the amplifier are configured to be controlled by one of the one or more additional circuits.

13. The system of claim 1, wherein the power converter comprises a boost converter configured to boost a power converter supply voltage that supplies electrical energy to the power converter to the intermediate voltage such that the intermediate voltage is greater than the power converter supply voltage.

14. The system of claim 1, wherein each of the one or more additional circuits comprises a respective power converter and a respective amplifier, the power converter and each respective power converter configured to generate the intermediate voltage for sharing among the amplifier and each respective amplifier.

15. The system of claim 14, wherein the circuit comprises a control subsystem exclusive to the circuit and configured to manage and control operation of the power converter and the amplifier based on one or more programmed thresholds associated with the circuit.

16. The system of claim 15, wherein the power converter is limited in an amount of current it generates and the one or more programmed thresholds include a threshold for selectively activating or deactivating the power converter.

17. A method comprising, in a circuit having a power converter and an amplifier:
generating an intermediate voltage by the power converter;
providing, by the power converter, the intermediate voltage as an amplifier supply voltage to the amplifier; and
sharing, by the power converter, the intermediate voltage with one or more additional circuits external to the circuit, wherein at least one of the one or more additional circuits comprises a second power converter and a second amplifier and the power converter and the second power converter are configured to generate the intermediate voltage for sharing among the amplifier and the second amplifier.

18. The method of claim 17, wherein the circuit comprises a single integrated circuit comprising the power converter and the amplifier.

19. The method of claim 17, further comprising, communicating information between the circuit and the one or more additional circuits via a shared communications bus.

20. The method of claim 19, wherein the information comprises at least one of:
a magnitude of the intermediate voltage;
a current drawn by a power converter supply voltage that supplies electrical energy to the power converter;
a current delivered by the power converter to the amplifier and a second circuit of the one or more additional circuits;
a target current for a power converter of the second circuit;
a control parameter for the power converter of the second circuit; and
timing information associated with the amplifier and the second circuit.

21. The method of claim 20, wherein the timing information comprises phase information or frequency information of the power converter of the second circuit.

22. The method of claim 19, wherein each of the one or more additional circuits comprises a respective power converter and a respective amplifier, the power converter and each respective power converter configured to generate the intermediate voltage for sharing among the amplifier and each respective amplifier.

23. The method of claim 19, further comprising managing and controlling operation of the amplifier, and the respective power converters and respective amplifiers of each of the one or more additional circuits with a control subsystem of the circuit.

24. The method of claim 23, further comprising balancing and managing, by a control subsystem, power delivery from the power converter and each respective power converter in accordance with a desired power control setting.

25. The method of claim 24, further comprising balancing and managing power delivery from the power converter and each respective power converter by selectively activating and deactivating the power converter and each respective power converter based on combined loads of the amplifier and the respective amplifiers.

26. The method of claim 24, further comprising balancing and managing power delivery from the power converter and each respective power converter by selectively activating and deactivating the power converter and each respective power converter based on the control parameter.

27. The method of claim 23, further comprising at least one of the following:
determining a total number of the power converter and the respective power converters;
managing individual power delivery from each of the power converter and the respective power converters;
controlling operations of the amplifier and the respective amplifiers based on the intermediate voltage and individual output loads of the amplifier and the respective amplifiers; and
controlling relative phase operations of the power converter and the respective power converters.

28. The method of claim 19, wherein the power converter and the amplifier are configured to be controlled by one of the one or more additional circuits.

29. The method of claim 17, wherein the power converter comprises a boost converter configured to boost a power converter supply voltage that supplies electrical energy to the power converter to the intermediate voltage such that the intermediate voltage is greater than the power converter supply voltage.

30. The method of claim 17, wherein each of the one or more additional circuits comprises a respective power converter and a respective amplifier, the power converter and each respective power converter configured to generate the intermediate voltage for sharing among the amplifier and each respective amplifier.

31. The method of claim 30, further comprising managing and controlling, by a control subsystem exclusive to the circuit, operation of the power converter and the amplifier based on one or more programmed thresholds associated with the circuit.

32. The method of claim 31, wherein the power converter is limited in an amount of current it generates and the one or more programmed thresholds include a threshold for selectively activating or deactivating the power converter.

33. The method of claim 17, wherein the one or more additional circuits comprise the second power converter and a load, the power converter and the second power converter configured to generate the intermediate voltage for sharing among the amplifier and the load.

34. The system of claim 1, wherein the one or more additional circuits comprise the second power converter and a load, the power converter and the second power converter configured to generate the intermediate voltage for sharing among the amplifier and the load.

* * * * *